(12) United States Patent
Chen et al.

(10) Patent No.: US 8,472,643 B2
(45) Date of Patent: Jun. 25, 2013

(54) POWER AMPLIFIER AND METHOD FOR RESTRAINING POWER OF IMPROVED POWER AMPLIFIER

(75) Inventors: Ming-Hsiung Chen, Taipei (TW); Shang-Shu Chung, Taipei (TW); Tung-Sheng Ku, Taipei (TW)

(73) Assignee: Amazing Microelectronic Corp. (TW)

( * ) Notice: Subject to any disclaimer, the term of this patent is extended or adjusted under 35 U.S.C. 154(b) by 858 days.

(21) Appl. No.: 12/616,354

(22) Filed: Nov. 11, 2009

(65) Prior Publication Data

US 2011/0110538 A1    May 12, 2011

(51) Int. Cl.
*H03F 3/68* (2006.01)
*H03F 3/217* (2006.01)
*H04R 5/04* (2006.01)

(52) U.S. Cl.
CPC .. *H03F 3/68* (2013.01); *H04R 5/04* (2013.01); *H03F 3/217* (2013.01)
USPC ............... 381/120; 381/28; 330/10; 330/251; 330/207 A (58) Field of Classification Search
USPC .................... 381/28, 120; 330/10, 251, 207 A
See application file for complete search history.

(56) References Cited

U.S. PATENT DOCUMENTS

| | | | | |
|---|---|---|---|---|
| 4,982,435 A | * | 1/1991 | Kato et al. | 381/102 |
| 2008/0284508 A1 | * | 11/2008 | Walker et al. | 330/10 |

* cited by examiner

*Primary Examiner* — Duc Nguyen
*Assistant Examiner* — George Monikang (57) ABSTRACT

The present invention is related to an improved power amplifier and a method for restraining power of the improved power amplifier. The improved power amplifier has an output power restraint unit, and the output power restraint unit is capable of restraining output power of the improved power amplifier when the output power is exceedingly large. A method for restraining power of a power amplifier, the method comprises the steps of: determining whether power of output powers signal are exceedingly large through a power signal transformation unit, if yes, adjusting two variable resistor of an input amplifier unit for adjusting the power of the power signals, and outputting the adjusted power signals for driving a load via output terminals of the power amplifier.

11 Claims, 10 Drawing Sheets

POWER AMPLIFIER AND METHOD FOR RESTRAINING POWER OF IMPROVED POWER AMPLIFIER

BACKGROUND OF THE INVENTION

1. Technical Field

The present invention relates to a power amplifier, and more particularly, to a power amplifier capable of restraining power and a method for restraining the power of the power amplifier.

2. Description of Related Art

Conventional power amplifiers may be classified into Class D power amplifiers and Class AB power amplifiers, among which the Class D power amplifiers are configured to output pulse modulated signals and the Class AB power amplifiers are configured to output linear signals. Owing to the advantage of high efficiency thereof, the Class D power amplifiers have now become a byword for power amplifiers.

Figure 1:
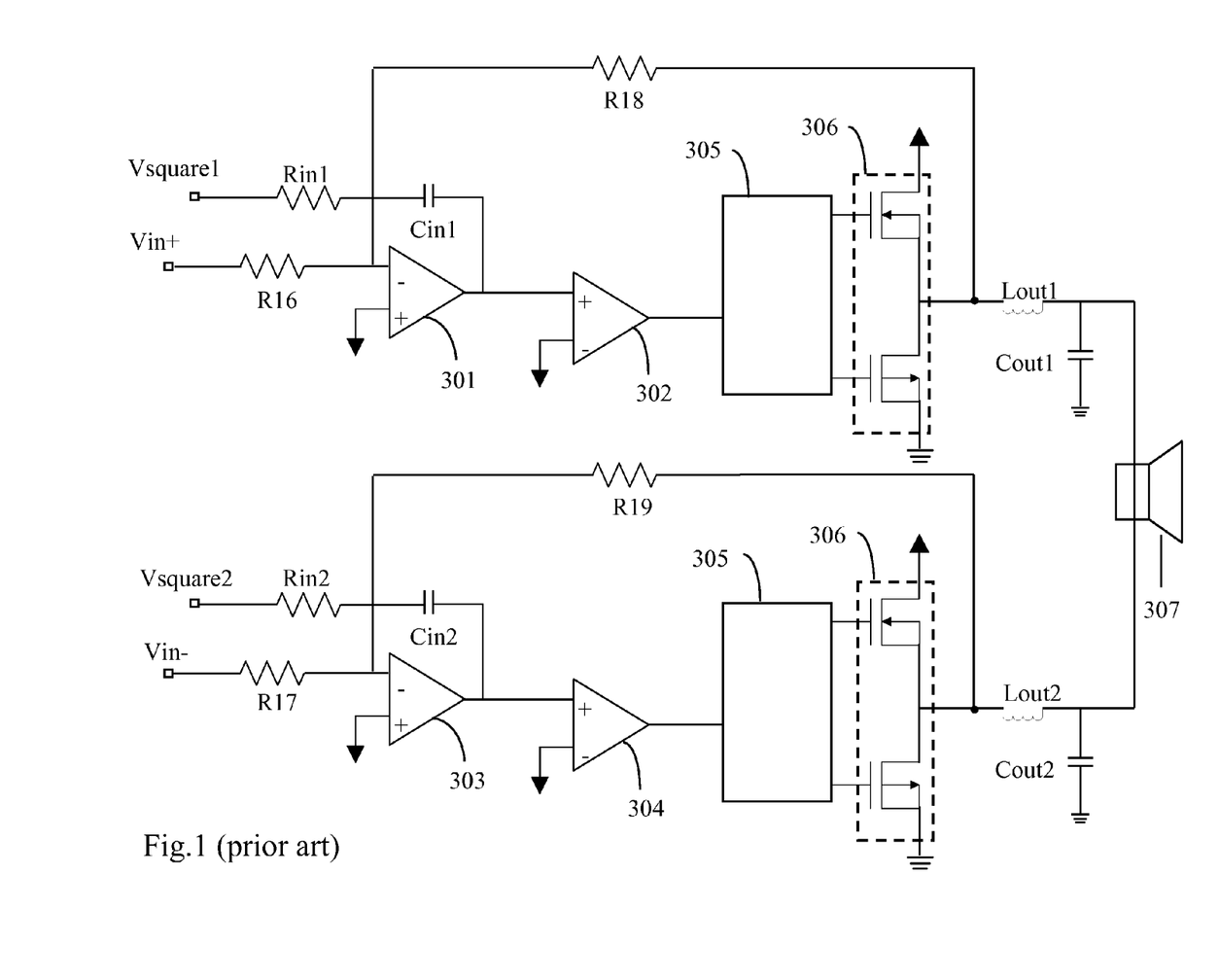
FIG. 1 is a circuit diagram of a conventional power amplifier.

Referring to FIG. 1, there is shown a circuit diagram of a conventional Class D power amplifier in which a dual-terminal output configuration is formed by a positive output terminal and a negative output terminal. This Class D power amplifier is advantageous in that by using the dual-terminal output configuration to drive a speaker 307, the driving power can be increased so that the speaker 307 can play the audio sound more efficiently.

Operation of this Class D power amplifier in the dual-terminal output configuration will now be described with reference to a single terminal as follows. From the terminal Vin, audio signals are inputted into an operational amplifier 301 and, by means of an integrator composed of the operational amplifier 301, a resistor R16 and a capacitor Cinl, the audio signals are transformed into self-oscillating triangular wave signals. Furthermore, square wave signals Vsquarel are inputted into the operational amplifier 301 via the terminal Rinl to synchronize the frequency of the triangular wave signals. Then, pulse-modulated signals are outputted through a comparator 302 to a pre-drive 305 which, according to the pulse-modulated signals, controls the on/off status of a power CMOS circuit 306 disposed at the output terminal, thereby to output signals for driving the speaker 307.

What described above is the circuit construction and operation of the conventional Class D power amplifier. The conventional Class D power amplifier is advantageous in that, the square wave signals are used as an input to control a carrier frequency of the output signals, and design of a square wave circuit is much simpler than that of a triangular wave circuit that is conventionally used. This saves room for circuits in the IC design and consequently reduces cost of the circuit layout. However, although the dual-terminal output configuration of the Class D power amplifier in which both the positive output terminal and the negative output terminal output signals can provide increased power for driving a load (e.g., the speaker), there is a risk that the load might be damaged due to an excessively large output power if a device for restraining power amplification is not provided.

Accordingly, in view of the shortcomings of the conventional Class D power amplifiers, the inventor of the present invention has made great efforts to make improvement thereon and finally provides an improved power amplifier and a method for restraining power of the improved power amplifier.

SUMMARY OF THE INVENTION

The primary objective of the present invention is to provide an improved power amplifier, which is provided with a circuit device for restraining the output power to prevent damage of a load due to an excessive output power.

Another objective of the present invention is to provide a method for restraining power of a power amplifier. According to this method, a voltage level to which a capacitor is charged by a power signal at the output terminal is compared against a voltage level to which a capacitor is charged by a reference signal at the reference terminal, and then a comparison result is outputted through a flip-flop to limit the output power.

To accomplish the primary objective described above, an improved power amplifier is provided, which comprises: an input amplifier unit; at least one pulse modulation unit; at least one pre-drive unit; at least one output stage transistor set; a power amplifier positive output terminal; a power amplifier negative output terminal; and a output power restraint unit. The output power restraint unit comprises an oscillation wave transformation unit and a power signal transformation unit. The power signal transformation unit is configured to transform power signals into a logic capacitor voltage, which is then compared against a charging capacitor voltage outputted by the oscillation wave transformation unit. If the logical capacitor voltage exceeds the charging capacitor voltage, it means that the output power is excessively high, in which case the power signal transformation unit feeds back a signal to the input amplifier unit to decrease an output gain of the input amplifier unit, thereby restraining the power of the power signals.

Also, to accomplish the another objective described above, a method for restraining power of a power amplifier is provided, which comprises the following steps of: (1) outputting power signals from a power amplifier positive output terminal and a power amplifier negative output terminal; (2) receiving the power signals at an output power restraint unit; (3) outputting a charging capacitor voltage by an oscillation wave transformation unit; (4) outputting a logic capacitor voltage by a power signal transformation unit; (5) determining whether the power of the output power signals is excessively large by the power signal transformation unit and if yes, executing step (6); otherwise, executing step (7); (6) modulating the power of the power signals by modulating two variable resistors of an input amplifier unit; and (7) outputting the power signals by the power amplifier positive output terminal and the power amplifier negative output terminal respectively to drive a load.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To explain the improved power amplifier and the method for restraining the power of the improved power amplifier of the present invention more clearly, detailed description will be made hereinbelow with reference to the attached drawings.

Figure 2:
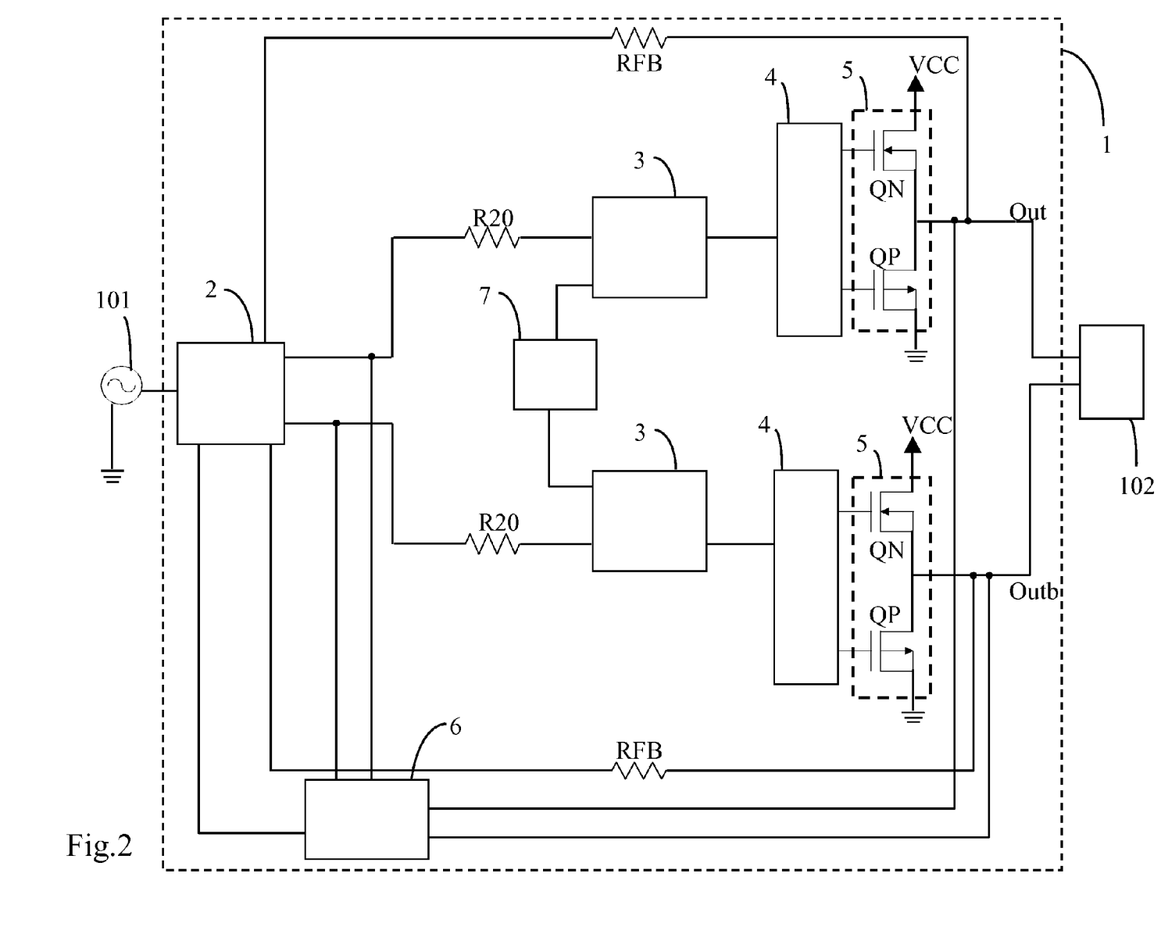
FIG. 2 is a circuit diagram of an improved power amplifier according to the present invention.

Referring to FIG. 2, there is shown a circuit diagram of an improved power amplifier 1 according to the present invention, which comprises: an input amplifier unit 2, two sets of pulse modulation units 3, two sets of pre-drive units 4, two output stage transistor sets 5, a power amplifier positive output terminal Out, a power amplifier negative output terminal Outb, an output power restraint unit 6, a current control unit 7, two feedback resistors RFB, and two input resistors R20.

Figure 3:
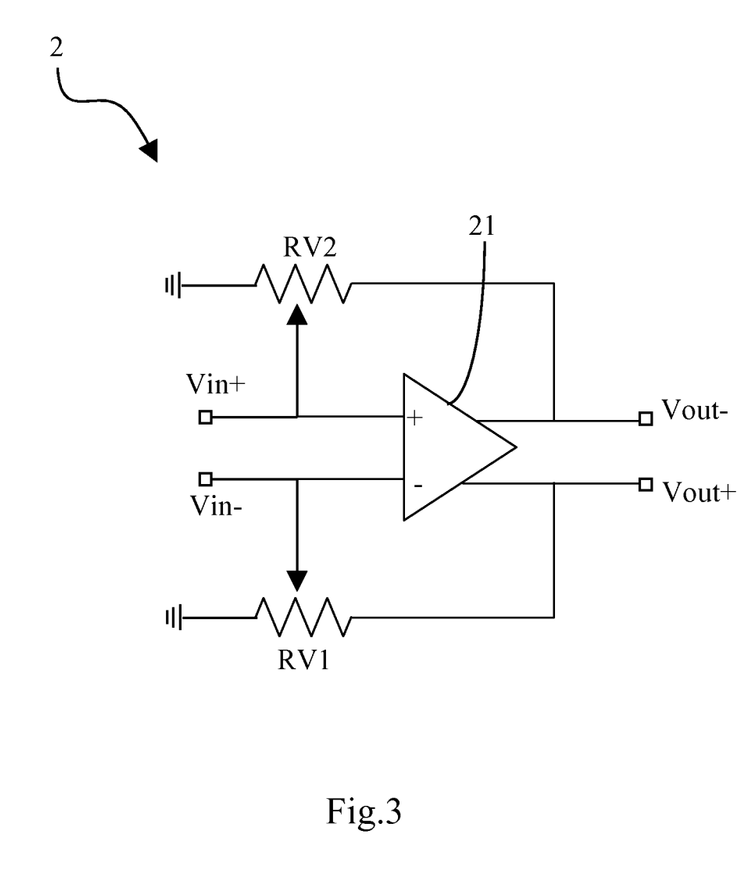
FIG. 3 is a circuit diagram of an input amplifier unit according to the present invention.

The input amplifier unit 2 is coupled to an input source 101 to receive input signals and configured to amplify the input signals to output amplified signals. Referring next to FIG. 3, there is shown a circuit diagram of the input amplifier unit 2. The input amplifier unit 2 comprises a fully differential amplifier 21 and two variable resistors RV1, RV2. The fully differential amplifier 21 comprises an amplifier positive input terminal Vin+, an amplifier negative input terminal Vin−, an amplifier positive output terminal Vout+ and an amplifier negative output terminal Vout−. The amplifier positive input terminal Vin+ and the amplifier negative input terminal Vin− are coupled to the input source 101, while the amplifier positive output terminal Vout+ and the amplifier negative output terminal Vout− are coupled to the pulse modulation unit 3 of the next stage respectively. The fully differential amplifier 21 is configured to amplify the input signals to output the amplified signals to the pulse modulation unit 3. The variable resistor RV1 is coupled between the amplifier positive input terminal and the amplifier negative output terminal, while the variable resistor RV2 is coupled between the amplifier negative input terminal and the amplifier positive output terminal. By adjusting the resistances of the variable resistors RV1, RV2, an output gain of the fully differential amplifier 21 can be modulated.

Figure 4:
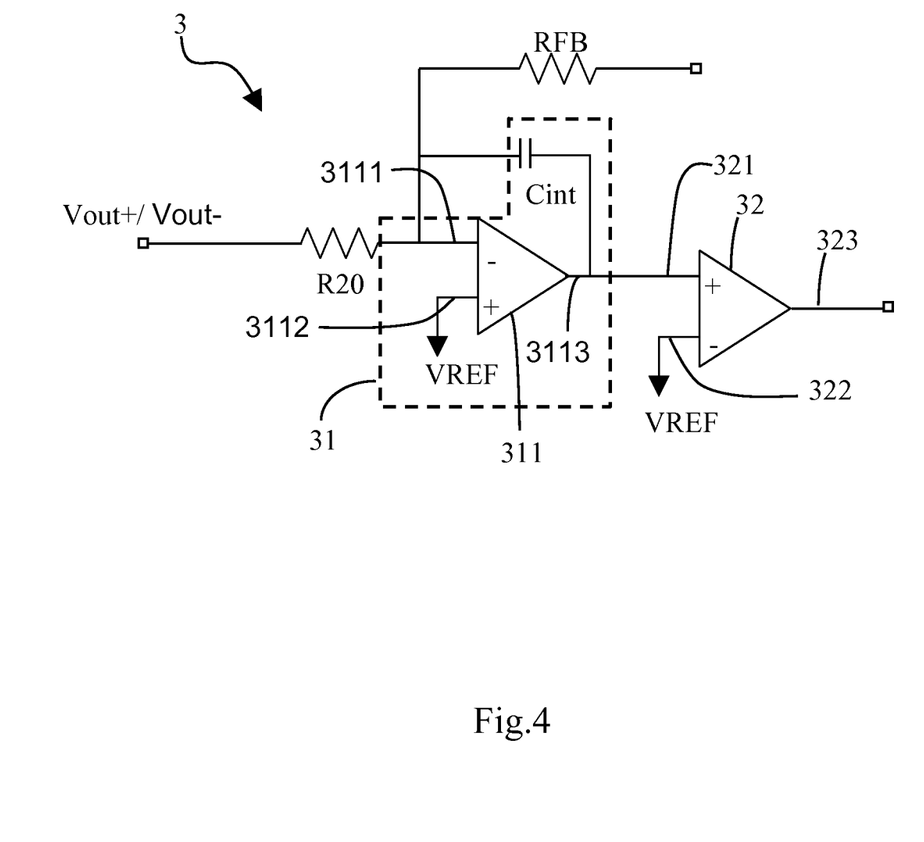
FIG. 4 is a circuit diagram of a pulse modulation unit according to the present invention.

The two sets of pulse modulation units 3 are coupled to the input amplifier unit 2 to receive the amplified signals and configured to perform pulse modulation on the amplified signals to output pulse-modulated signals. Referring next to FIG. 4, there is shown a circuit diagram of one of the pulse modulation units. The pulse modulation unit 3 comprises an integrator 31 and a first comparator 32. The integrator 31 is configured to transform the amplified signals into triangular wave signals and comprises: an integrator capacitor Cint, being coupled to an input resistor R20 and configured to integrate the amplified signals by virtue of the charging and discharging properties of the integrator capacitor Cint; and an operational amplifier (OPA) 311, which has an operational amplifier positive input terminal 3112, an operational amplifier negative input terminal 3111 and an operational amplifier output terminal 3113. The operational amplifier positive input terminal 3112 is coupled to an externally applied reference voltage VREF, while the operational amplifier negative input terminal 3111 is coupled to the input resistor R20 and the integrator capacitor Cint. When the integrator capacitor Cint is charged and discharged repeatedly, the triangular wave signals in a periodic nature is outputted by the operational amplifier 311 to the pre-drive unit 4 of the next stage. The first comparator 32 has a first comparator positive input terminal 321, a first comparator negative input terminal 322 and a first comparator output terminal 323. The first comparator positive input terminal 321 is coupled to the operational amplifier output terminal 3113 to receive the triangular wave signals, the first comparator negative input terminal 322 is coupled to the reference voltage VREF, and the first comparator output terminal 323 is coupled to the pre-drive unit 4. Through comparison of the reference voltage VREF against the triangular wave signals, the first comparator 32 outputs the pulse-modulated signals to the pre-drive unit 4.

The two sets of pre-drive units 4 are coupled to the pulse modulation units 3 to receive the pulse-modulated signals and configured to control the output stage transistor set 5 of the next stage according to the pulse-modulated signals respectively.

The two output stage transistor sets 5 are coupled to the pre-drive units 4. The pre-drive unit sets 4 receive the pulse-modulated signals outputted by the pulse modulation units 3 and, according to the pulse-modulated signals, control the on/off status of the output stage transistor sets 5 so that the output stage transistor sets 5 output power signals.

The power amplifier positive output terminal Out is coupled to the output stage transistor sets 5 to receive the power signals for driving a load 102.

The power amplifier negative output terminal Outb is coupled to the output stage transistor sets 5 to receive the power signals for driving the load 102.

Figure 5:
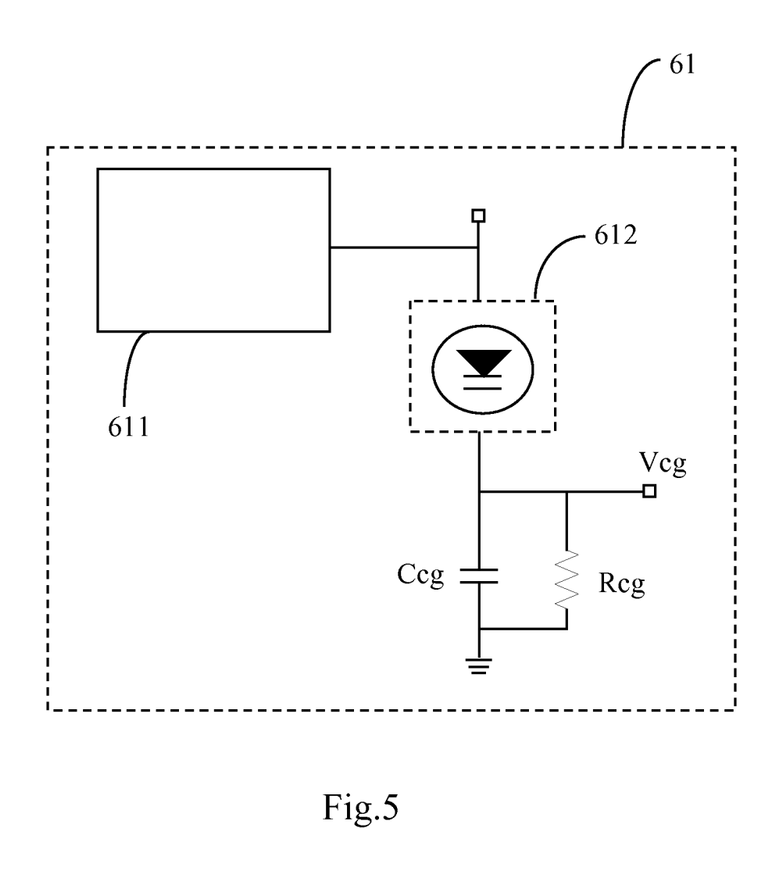
FIG. 5 is a circuit diagram of an oscillation wave transformation unit according to the present invention.
Figure 6:
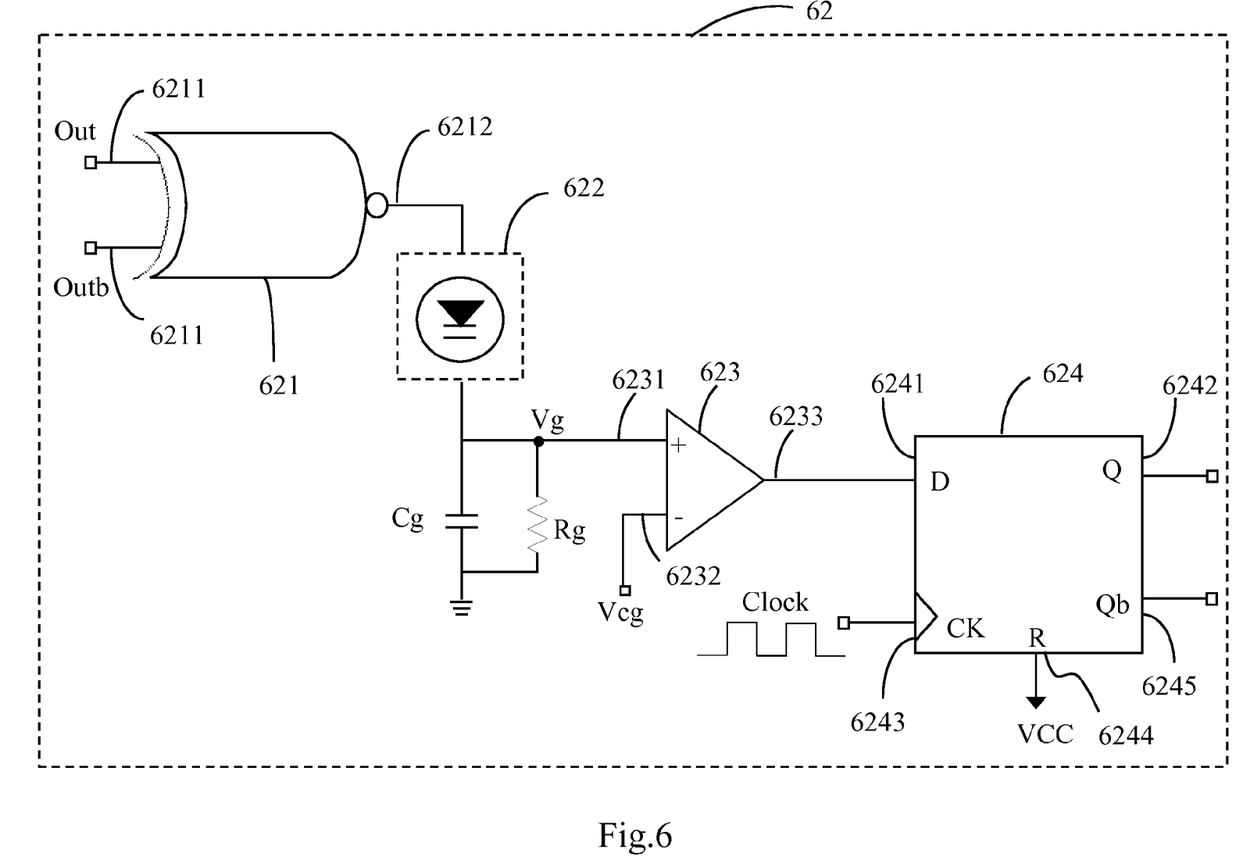
FIG. 6 is a circuit diagram of a power signal transformation unit according to the present invention.

The output power restraint unit 6 is coupled between the power amplifier positive output terminal Out, the power amplifier negative output terminal Outb and the input amplifier unit 2 to receive the power signals and restrain the power of the improved power amplifier 1. The output power restraint unit 6 comprises an oscillation wave transformation unit 61 and a power signal transformation unit 62. The oscillation wave transformation unit 61 is configured to generate oscillation wave signals and output a charging capacitor voltage Vcg. Referring to FIG. 5, there is shown a circuit diagram of the oscillation wave transformation unit 61. The oscillation wave transformation unit 61 comprises: an oscillation wave generator 611, being configured to generate and output the oscillation wave signals; a first current switch 612, being coupled to the oscillation wave generator 611 to receive the oscillation wave signals and transform it into first current signals; a charging capacitor Ccg, being coupled to the first current switch 612, and when the first current signals are inputted into the charging capacitor Ccg, the charging capacitor Ccg is charged to generate the charging capacitor voltage Vcg; and a charging resistor Rcg, being connected in parallel to the charging capacitor Ccg, and when the first current signals are outputted by the first current switch 612 to charge the charging capacitor Ccg, the charging capacitor voltage Vcg will appear between the charging resistor Rcg and the ground. The power signal transformation unit 62 is coupled to the oscillation wave transformation unit 61, the power amplifier positive output terminal Out and the power amplifier negative output terminal Outb, and is configured to transform the power signals into a logic capacitor voltage Vg and compare the logic capacitor voltage Vg against the charging capacitor voltage Vcg outputted by the oscillation wave transformation unit 61. If the logic capacitor voltage Vg exceeds the logic capacitor voltage Vcg, it means that the output power is too high, in which case the power signal transformation unit 62 feeds back a signal to the input amplifier unit 2 to decrease the output gain, thereby restraining the power. Referring also to FIG. 6, there is shown a circuit diagram of the power signal transformation unit 62. The power signal transformation unit 62 comprises an XNOR logic gate 621, a second current switch 622, a logic capacitor Cg, a logic resistor Rg, a second comparator 623 and a D flip-flop 624. The XNOR logic gate 621 has two logic gate input terminals 6211 and a logic gate output terminal 6212. The two logic gate input terminals 6211 are coupled to the power amplifier positive output terminal Out and the power amplifier negative output terminal Outb respectively to receive the power signals. After performing a logic processing on the power signals, the XNOR logic gate 621 outputs logic signals via the logic gate output terminal 6212. The second current switch 622 is coupled to the output terminal of the logic gate to receive the logic signals and perform a current transformation on the logic signals to output second current signals. The logic capacitor Cg is coupled to the second current switch 622, and when the second current signals are inputted into the logic capacitor Cg, the logic capacitor Cg is charged to generate the logic capacitor voltage Vg. The logic resistor Rg is connected in parallel to the logic capacitor Cg, and when the second current switch 622 outputs the second current signals to charge the logic capacitor Cg, the logic capacitor voltage Vg will appear between the logic resistor Rg and the ground. The second comparator 623 has a second comparator positive input terminal 6231, a second comparator negative input terminal 6232 and a second comparator output terminal 6233. The second comparator positive input terminal 6231 is coupled to the second current switch 622, and the second comparator negative input terminal 6232 is coupled to the reference voltage VREF. When the logic capacitor voltage Vg is inputted into the second comparator 612 via the logic resistor Rg, a comparison of the logic capacitor voltage Vg against the reference voltage VREF is made by the second comparator 623 to output a comparison signal. The D flip-flop 624 has a D terminal 6241, a CK terminal 6243, a Q terminal 6242, a Qb terminal 6245 and an R terminal 6244. The D terminal 6241 is coupled to the output terminal of the second comparator 623, the CK terminal 6243 is coupled to clock signals, the Q terminal 6242 is coupled to the input amplifier unit 2, the Qb terminal 6245 is in a floating status, and the R terminal 6244 is coupled to an externally applied high-level voltage VCC. When the comparison signal is outputted by the second comparator 623 via the D terminal 6241 to the D flip-flop 624, the D flip-flop 624 outputs a flip-flop signal according to the characteristic response thereof for feedback to the input amplifier unit 2, thereby to restrain the output power by decreasing the output gain of the input amplifier unit 2.

The current control unit 7 has two terminals coupled to the pulse modulation unit 3. The current control unit 7 is configured to generate current control signals, which is mixed with the amplified signals to produce current modulation signals.

One of the two feedback resistors RFB is coupled between the positive output terminal Out and the input amplifier unit 2 while the other is coupled between the negative output terminal Outb and the input amplifier unit 2. Through the two feedback resistors RFB, the signals from the positive output terminal Out and the negative output terminal Outb can be fed back to the input amplifier unit 2.

The two input resistors R20 are coupled between the input amplifier unit 2 and the pulse modulation unit 3 for use as buffer interfaces of inputting the amplified signals into the pulse modulation unit 3.

Figure 7:
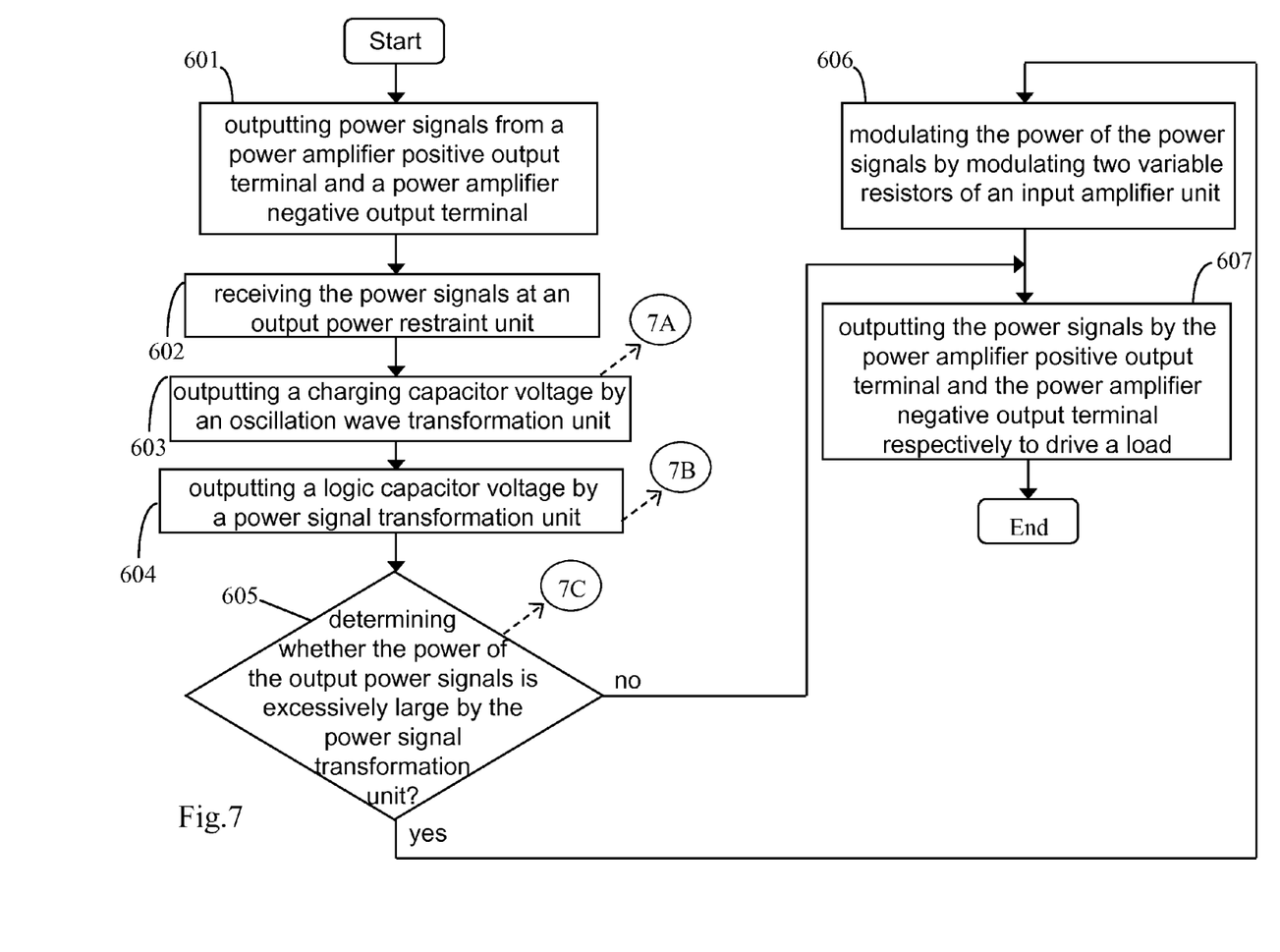
FIG. 7 is a flowchart of a method for restraining power of a power amplifier according to the present invention.

Having thus described preferred embodiments of individual circuit units of the improved power amplifier in detail, referring next to FIG. 7, there is shown a flowchart of a method for restraining power of the power amplifier. The method for restraining power of the power amplifier comprises the following steps.

This method begins with step (601) where power signals are outputted from a power amplifier positive output terminal Out and a power amplifier negative output terminal Outb. Then in step (602), an output power restraint unit 6 receives the power signals. Next in step (603), an oscillation wave transformation unit 61 outputs a charging capacitor voltage Vcg, and in step (604), a power signal transformation unit 62 outputs a logic capacitor voltage Vg. In step (605), the power signal transformation unit 62 determines whether the power of the power signals outputted is too large. If yes, step (606) is executed to modulate power of the power signals by modulating two variable resistors RV1, RV2 of an input amplifier unit 2; otherwise, step (607) is executed to output the power signals from the power amplifier positive output terminal Out and the power amplifier negative output terminal Outb respectively to drive a load 102.

Figure 8:
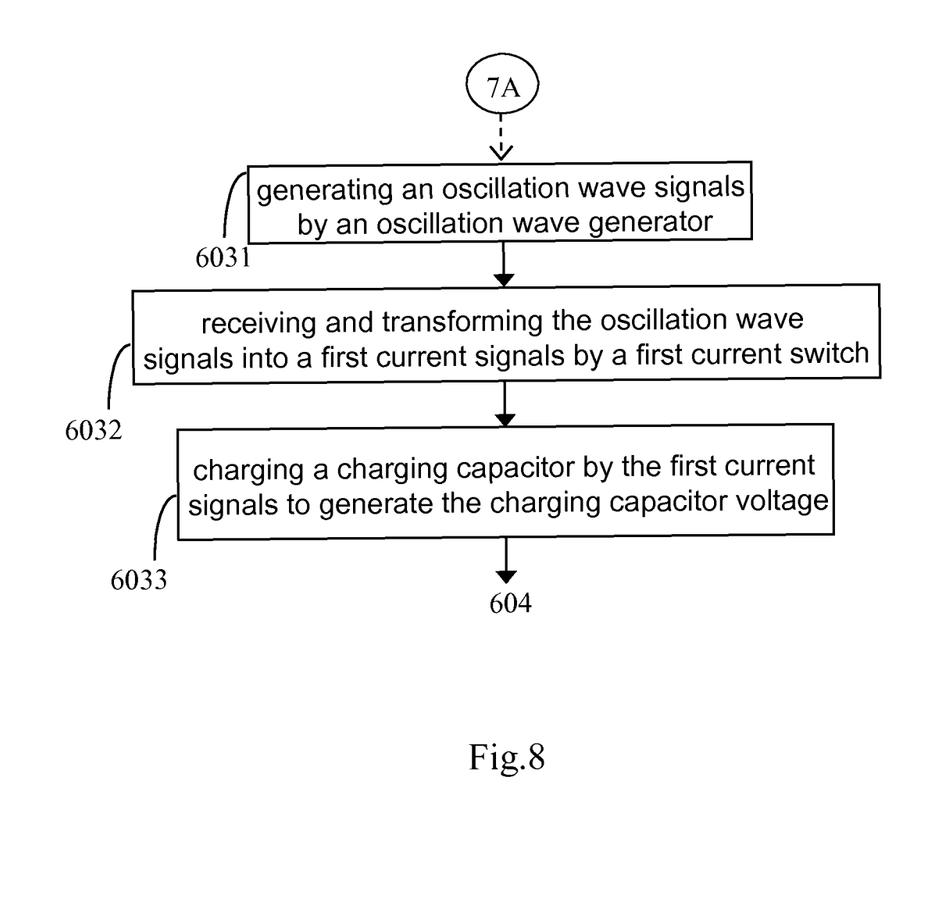
FIG. 8 is a detailed flowchart of step (603) according to the present invention.

Referring to FIG. 8, there is shown a detailed flowchart of step (603) of the method for restraining power of the power amplifier. The step (603) further comprises the following steps.

Initially in step (6031), an oscillation wave generator 611 generates oscillation wave signals. Then in step (6032), a first current switch 612 receives the oscillation wave signals and transforms that into first current signals. Next in step (6033), a charging capacitor Ccg is charged by the first current signals to generate the charging capacitor voltage Vcg. Afterwards, the method proceeds to step (604).

Figure 9:
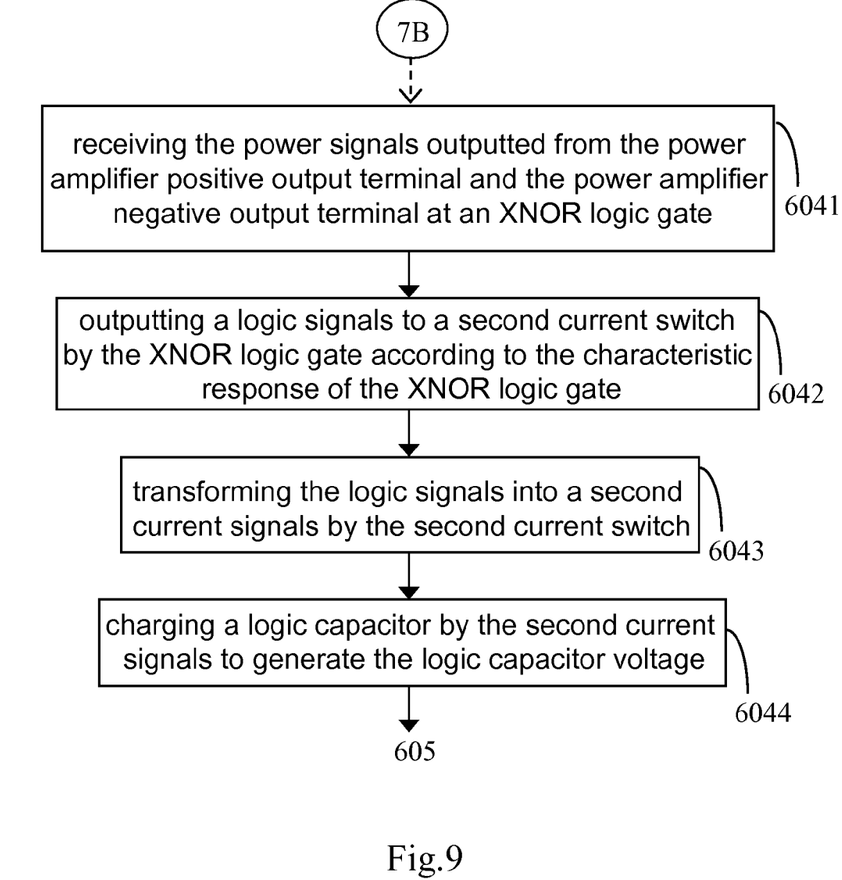
FIG. 9 is a detailed flowchart of step (604) according to the present invention.

Referring next to FIG. 9, there is shown a detailed flowchart of step (604), which further comprises the following steps.

Firstly in step (6041), an XNOR logic gate receives the power signals outputted from the power amplifier positive output terminal Out and the power amplifier negative output terminal Outb. Then in step (6042), according to the characteristic response thereof, the XNOR logic gate 621 outputs logic signals to a second current switch 622. Next in step (6043), the second current switch 622 transforms the logic signals into second current signals, and in step (6044), a logic capacitor Cg is charged by the second current signals to generate the logic capacitor voltage Vg. Afterwards, the method proceeds to step (605).

Figure 10:
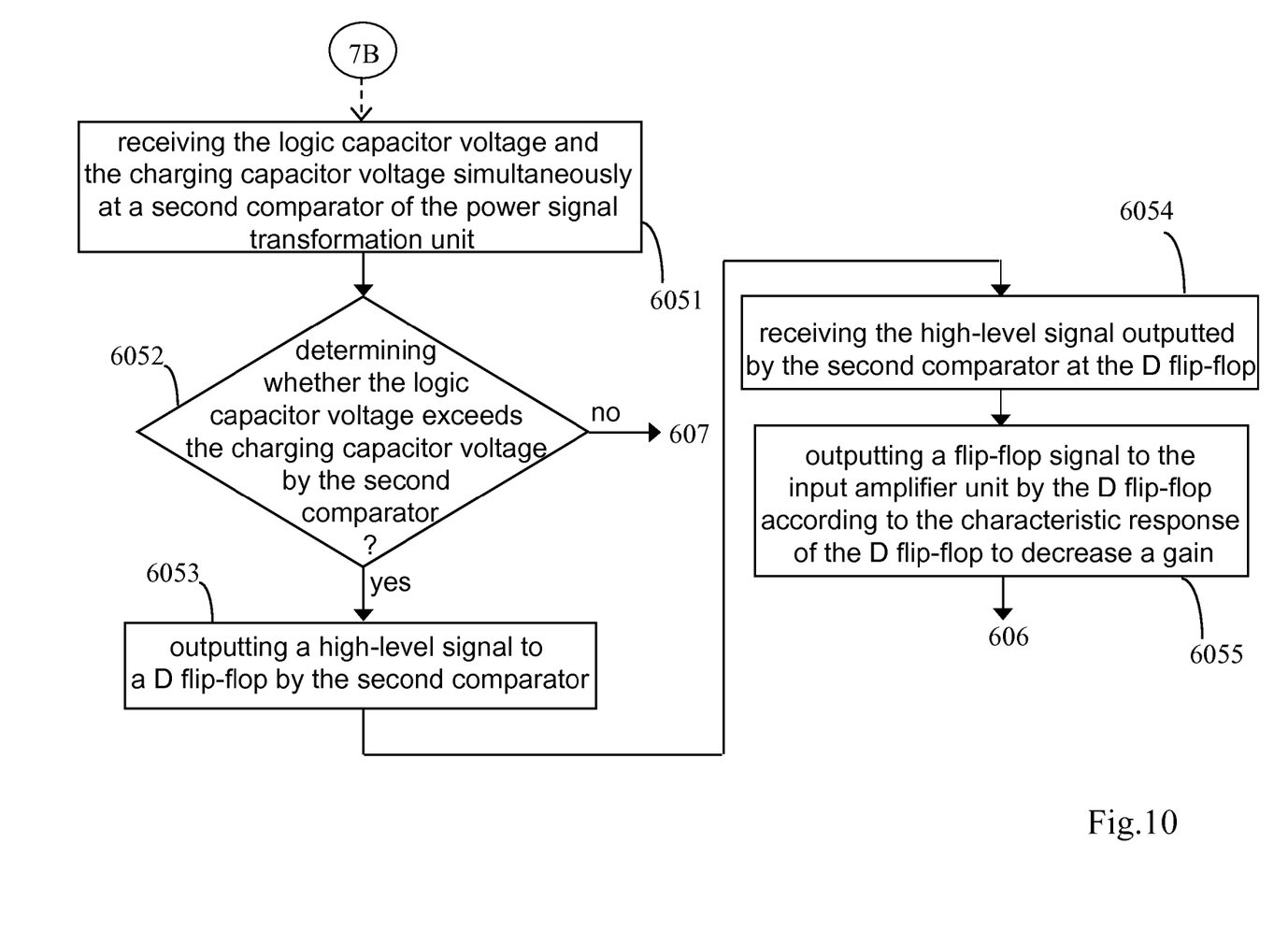
FIG. 10 is a detailed flowchart of step (605) according to the present invention.

Referring next to FIG. 10, there is shown a detailed flowchart of step (605), which further comprises the following steps.

Firstly in step (6051), a second comparator 623 of the power signal transformation unit receives the logic capacitor voltage Vg and the charging capacitor voltage Vcg at the same time. Then in step (6052), the second comparator 623 determines whether the logic capacitor voltage Vg exceeds the charging capacitor voltage Vcg. If yes, the method proceeds to step (6053); otherwise, the method proceeds to step (607). In step (6053), the second comparator 623 outputs a high-level signal to a D flip-flop 624. Next in step (6054), the D flip-flop 624 receives the high-level signal outputted by the second comparator 623. Finally in step (6055), according to the characteristic response thereof, the D flip-flop 624 outputs a flip-flop signal to the input amplifier unit 2 to decrease the output gain. Afterwards, the method proceeds to step (606).

Thus, the improved power amplifier and the method for restraining power of the improved power amplifier have been described clearly. In summary, the present invention offers the following advantages over conventional power amplifiers:

1. by means of a set of circuit devices of the output power restraint unit, output power of the power amplifier can be restrained when the output power goes excessively large, thus avoiding damage to the load end (a motor or a speaker); and 2. through the method for restraining power of the improved power amplifier disclosed by the present invention, a second comparator can compare a charging capacitor voltage against a logic capacitor voltage and send a comparison result to a D flip-flop set which, according to the characteristic response thereof, feeds back a signal to an input amplifier unit to adjust the output gain. Thereby, the output power of the power amplifier can be automatically monitored and restrained.

The above description is made on an embodiment of the present invention. However, this embodiment is not intended to limit scope of the present invention, and all equivalent implementations or alterations within the spirit of the present invention still fall within the scope of the present invention.

What is claimed is:

1. An improved power amplifier, comprising:
   an input amplifier unit, being coupled to an input source to receive input signals and configured to amplify the input signals to output amplified signals;
   at least one pulse modulation unit, being coupled to the input amplifier unit to receive the amplified signals and configured to perform pulse modulation on the amplified signals to output pulse-modulated signals;
   at least one pre-drive unit, being coupled to the pulse modulation unit to receive the pulse-modulated signals and configured to control a circuit unit of a next stage according to the pulse-modulated signals;
   at least one output stage transistor set, being coupled to the pre-drive unit, wherein the pre-drive unit receives the pulse-modulated signals outputted by the pulse modulation unit and, according to the pulse-modulated signals, controls the on/off status of the output stage transistor set so that the output stage transistor set outputs power signals;
   a power amplifier positive output terminal, being coupled to the output stage transistor sets to receive the power signals for driving a load;
   a power amplifier negative output terminal, being coupled to the output stage transistor set to receive the power signals for driving the load; and
   an output power restraint unit, being coupled between the power amplifier positive output terminal, the power amplifier negative output terminal and the input amplifier unit to receive the power signals and restrain power of the improved power amplifier, the output power restraint unit comprising:
      an oscillation wave transformation unit, being configured to generate oscillation wave signals and output a charging capacitor voltage; and
      a power signal transformation unit, being coupled to the oscillation wave transformation unit, the power amplifier positive output terminal and the power amplifier negative output terminal, and being configured to transform the power signal into a logic capacitor voltage for comparison against the charging capacitor voltage outputted by the oscillation wave transformation unit, wherein when the logical capacitor voltage exceeds the charging capacitor voltage, it means that the output power is excessively high, in which case the power signal transformation unit feeds back a signal to the input amplifier unit to decrease an output gain, thereby restraining the power by decreasing the output gain of the input amplifier unit.

2. The improved power amplifier of claim 1, further comprising:
   a current control unit, being coupled to the pulse modulation unit and configured to generate current control signals, which is mixed with the amplified signals to produce current modulation signals;
   a plurality of feedback resistors, being coupled between the power amplifier positive output terminal, the power amplifier negative output terminal and the input amplifier unit to feed back signals to the input amplifier unit; and
   a plurality of input resistors, being coupled between the input amplifier unit and the pulse modulation unit for acting as a buffer interface of inputting the amplified signals into the pulse modulation unit.

3. The improved power amplifier of claim 1, wherein the input amplifier unit further comprises:
   a fully differential amplifier, comprising an amplifier positive input terminal, an amplifier negative input terminal, an amplifier positive output terminal and an amplifier negative output terminal, wherein the amplifier positive input terminal and the amplifier negative input terminal are coupled to the input source, while the amplifier positive output terminal and the amplifier negative output terminal are coupled to the pulse modulation unit respectively, and wherein the fully differential amplifier is configured to amplify the input signals to output the amplified signals to the pulse modulation unit; and
   two variable resistors, one of which is coupled between the amplifier positive input terminal and the amplifier negative output terminal, while the other is coupled between the amplifier negative input terminal and the amplifier positive output terminal, wherein by adjusting resistances of the variable resistors, the output gain of the fully differential amplifier is modulated.

4. The improved power amplifier of claim 2, wherein the pulse modulation unit further comprises:
   an integrator, being configured to transform the amplified signals into triangular wave signals, the integrator comprising:
      an integrator capacitor, being coupled to the input resistors and configured to integrate the amplified signals by virtue of charging and discharging properties of the integrator capacitor; and
      an operational amplifier, comprising an operational amplifier positive input terminal, an operational amplifier negative input terminal and an operational amplifier output terminal, wherein the operational amplifier positive input terminal is coupled to an externally applied reference voltage, and the operational amplifier negative input terminal is coupled to the input resistor and the integrator capacitor, and when the integrator capacitor is charged and discharged repeatedly, the triangular wave signals in a periodic nature is outputted by the operational amplifier to the pre-drive unit; and
   a first comparator, comprising a first comparator positive input terminal, a first comparator negative input terminal and a first comparator output terminal, the first comparator positive input terminal being coupled to the operational amplifier output terminal to receive the triangular wave signals, the first comparator negative input terminal being coupled to the externally applied reference voltage, and the first comparator output terminal being coupled to the pre-drive unit, wherein through comparison of the reference voltage against the triangular wave signals, the first comparator outputs the pulse modulated signals to the pre-drive unit.

5. The improved power amplifier of claim 1, wherein the oscillation wave transformation unit further comprises:
   an oscillation wave generator, being configured to generate and output the oscillation wave signals;
   a first current switch, being coupled to the oscillation wave generator to receive and transform the oscillation signals into first current signals;
   a charging capacitor, being coupled to the first current switch, wherein when the first current signals are inputted into the charging capacitor, the charging capacitor is charged to generate the charging capacitor voltage; and
   a charging resistor, being connected in parallel to the charging capacitor, wherein when the first current signals is outputted by the first current switch to charge the charging capacitor, the charging capacitor voltage appears between the charging resistor and a ground.

6. The improved power amplifier of claim 1, wherein the power signal transformation unit further comprises:
   an XNOR logic gate, comprising two logic gate input terminals and a logic gate output terminal, wherein the two logic gate input terminals are coupled to the power amplifier positive output terminal and the power amplifier negative output terminal respectively to receive the power signals, and after performing a logic processing on the power signals, the XNOR logic gate outputs logic signals via the logic gate output terminal;
   a second current switch, being coupled to the logic gate output terminal to receive the logic signals and perform a current switching on the logic signals to output second current signals;
   a logic capacitor, being coupled to the second current switch, wherein when the second current signal is inputted into the logic capacitor, the logic capacitor is charged to generate the logic capacitor voltage;
   a logic resistor, being connected in parallel to the logic capacitor, wherein when the second current switch outputs the second current signals to charge the logic capacitor, the logic capacitor voltage appears between the logic resistor and the ground;
   a second comparator, comprising a second comparator positive input terminal, a second comparator negative input terminal and a second comparator output terminal, wherein the second comparator positive input terminal is coupled to the logic resistor, and the second comparator negative input terminal is coupled to an externally applied reference voltage, and wherein when the logic capacitor voltage is inputted into the second comparator via the logic resistor, a comparison of the logic capacitor voltage against the reference voltage is made by the second comparator to output a comparison signal; and
   a D flip-flop, comprising a D terminal, a CK terminal, a Q terminal, a Qb terminal and an R terminal, the D terminal being coupled to the second comparator output terminal, the CK terminal being coupled to clock signals, the Q terminal being coupled to the input amplifier unit, the Qb terminal being in a floating status, and the R terminal being coupled to an externally applied high-level voltage, wherein when the comparison signal is outputted by the second comparator via the D terminal to the D flip-flop, the D flip-flop outputs a flip-flop signal according to the characteristic response thereof for feedback to the input amplifier unit, thereby to restrain the output power by decreasing the output gain.

7. The improved power amplifier of claim 1, wherein the load is a motor or a speaker.

8. A method for restraining power of a power amplifier, comprising the following steps of:
   (1) outputting power signals from a power amplifier positive output terminal and a power amplifier negative output terminal;
   (2) receiving the power signals at an output power restraint unit;
   (3) outputting a charging capacitor voltage by an oscillation wave transformation unit;
   (4) outputting a logic capacitor voltage by a power signal transformation unit;
   (51) receiving the logic capacitor voltage and the charging capacitor voltage simultaneously at a second comparator of the power signal transformation unit;
   (52) determining whether the logic capacitor voltage exceeds the charging capacitor voltage by the second comparator, and if yes, executing step (53); otherwise, executing the step (7) is;
   (53) outputting a high-level signal to a D flip-flop by the second comparator;
   (54) receiving the high-level signal outputted by the second comparator at the D flip-flop;
   (55) outputting a flip-flop signal to the input amplifier unit by the D flip-flop according to the characteristic response of the D flip-flop to decrease a gain;
   (6) modulating the power of the power signals by modulating two variable resistors of an input amplifier unit; and
   (7) outputting the power signals by the power amplifier positive output terminal and the power amplifier negative output terminal respectively to drive a load.

9. The method of claim 8, wherein the step (3) further comprises the following steps:
   (31) generating oscillation wave signals by an oscillation wave generator;
   (32) receiving and transforming the oscillation wave signals into first current signals by a first current switch; and
   (33) charging a charging capacitor by the first current signals to generate the charging capacitor voltage.

10. The method of claim 8, wherein the step (4) further comprises the following steps:
   (41) receiving the power signals outputted from the power amplifier positive output terminal and the power amplifier negative output terminal at an XNOR logic gate;
   (42) outputting logic signals to a second current switch by the XNOR logic gate according to the characteristic response of the XNOR logic gate;
   (43) transforming the logic signals into second current signals by the second current switch; and
   (44) charging a logic capacitor by the second current signals to generate the logic capacitor voltage.

11. The method of claim 8, wherein the load is a motor or a speaker.

* * * * *